(12) United States Patent
Morikawa et al.

(10) Patent No.: US 7,189,336 B2
(45) Date of Patent: *Mar. 13, 2007

(54) ETCHANT, METHOD FOR ROUGHENING COPPER SURFACE AND METHOD FOR PRODUCING PRINTED WIRING BOARD

(75) Inventors: Yoshihiko Morikawa, Kanagawa (JP); Kazunori Senbiki, Kanagawa (JP); Nobuhiro Yamazaki, Kanagawa (JP)

(73) Assignee: Ebara Densan Ltd. (JP)

( * ) Notice: Subject to any disclaimer, the term of this patent is extended or adjusted under 35 U.S.C. 154(b) by 73 days.

This patent is subject to a terminal disclaimer.

(21) Appl. No.: 10/393,874

(22) Filed: Mar. 21, 2003

(65) Prior Publication Data

US 2003/0201247 A1    Oct. 30, 2003

Related U.S. Application Data

(62) Division of application No. 08/901,700, filed on Jul. 28, 1997, now Pat. No. 6,544,436.

(30) Foreign Application Priority Data

Jul. 29, 1996 (JP) .................................. 8-216016
Aug. 7, 1996 (JP) .................................. 8-223276

(51) Int. Cl.
    *C23F 1/34* (2006.01)
(52) U.S. Cl. ........................ 216/106; 216/11; 216/13
(58) Field of Classification Search ................ 216/11, 216/13, 105, 106, 107
    See application file for complete search history.

(56) References Cited

U.S. PATENT DOCUMENTS

| 3,770,530 | A | * | 11/1973 | Fujimoto | .................. 216/50 |
|---|---|---|---|---|---|
| 4,892,776 | A | * | 1/1990 | Rice | .......................... 428/209 |
| 4,917,758 | A | | 4/1990 | Ishizuka et al. | |
| 5,294,291 | A | | 3/1994 | Akahoshi et al. | |
| 5,439,783 | A | * | 8/1995 | Akiyama et al. | ............ 430/331 |
| 5,474,798 | A | | 12/1995 | Larson et al. | |
| 5,532,094 | A | | 7/1996 | Arimura et al. | |
| 5,689,879 | A | | 11/1997 | Urasaki et al. | |
| 5,800,859 | A | * | 9/1998 | Price et al. | ..................... 427/98 |
| 5,807,493 | A | * | 9/1998 | Maki et al. | ................ 216/106 |
| 5,869,130 | A | * | 2/1999 | Ferrier | ........................ 148/251 |
| 6,036,758 | A | | 3/2000 | Fairweather | |
| 2004/0089838 | A1 | * | 5/2004 | Morikawa et al. | .............. 252/2 |

FOREIGN PATENT DOCUMENTS

EP         0 620 293 A1    10/1994

(Continued)

Primary Examiner—Allan Olsen
(74) Attorney, Agent, or Firm—Lerner, David, Littenberg, Krumholz & Mentlik, LLP

(57) ABSTRACT

An etchant and a method for roughening a copper surface each capable of permitting copper with roughened surface which exhibits acid resistance and permits a copper conductive pattern and an outer layer material to be firmly bonded to each other therethrough in manufacturing of a printed wiring board to simplify the manufacturing. The etchant may contain an oxo acid such as sulfuric acid, peroxide such as hydrogen peroxide and an auxiliary component such as an azole and chlorine. The azole may comprise benzotriazole (BTA). The chlorine may be in the form of sodium chloride (NaCl). The etchant permits a copper surface to be roughened in an acicular manner.

14 Claims, 15 Drawing Sheets

FOREIGN PATENT DOCUMENTS

| | | |
|---|---|---|
| JP | 57134563 | 8/1982 |
| JP | 01240683 | 9/1989 |
| JP | 03079778 | 4/1991 |
| JP | 07235752 | 9/1995 |
| JP | 08088459 | 4/1996 |
| JP | 08148811 | 6/1996 |
| JP | 11140669 | 5/1999 |
| WO | WO 9619097 A1 * | 6/1996 |

* cited by examiner

ETCHANT, METHOD FOR ROUGHENING COPPER SURFACE AND METHOD FOR PRODUCING PRINTED WIRING BOARD

This a divisional application of U.S. patent application Ser. No. 08/901,700, filed Jul. 28, 1997, now U.S. Pat. No. 6,544,436.

BACKGROUND OF THE INVENTION

This invention relates to techniques of etching a copper foil or copper plate, and more particularly to an etching solution or etchant for roughening a surface of a copper foil or copper plate so that the surface has acicular protrusions, a method for roughening a copper surface and a method for producing a printed wiring board in which a defect such as a pink ring or the like can be prevented from occurring and the number of manufacturing steps can be reduced.

A multi-layer printed wiring board has been conventionally made by laminating an inner layer material, an outer layer material and prepregs on each other. A copper-clad laminate on which a copper foil is laminated is used as the inner layer material and the like. In general, manufacturing of such a multi-layer printed wiring board is carried out in such a manner that the copper-clad laminate is subjected to a pretreatment such as a rust prevention and the like (preliminary treatment prior to circuit formation); the copper-clad laminate is then subjected to patterning and the like to form a copper conductive pattern layer (circuit formation); a roughening treatment is conducted to roughen a surface of the copper conductive pattern layer which is an inner layer material; an outer layer material such as resin, a film, ink or the like is laminated on the roughened surface of the inner layer material or copper conductive pattern layer to form a laminate (laminating); and the laminate is formed with through-holes and then subjected to electroplating.

As shown in FIG. 1, the preliminary treatment prior to the circuit formation generally includes removing a rust preventive film, washing with water, micro-etching, washing with water, rust preventing, washing with water and drying. The surface roughening as described above is executed by any one of a first process of forming a layer of copper oxide such as cuprous oxide or cupric oxide on the surface of the copper conductive pattern layer (blackening process), a second process of reducing such a copper oxide layer as described above to metallic copper using a reducing agent while keeping the configuration of the oxide layer (reducing process) and a third process of forming a metallic copper layer of coarse particles on a copper conductive pattern layer by electroless plating of copper (electroless copper plating process).

When the first process is employed, the following treatments are carried out sequentially: alkali degreasing, washing with water, acid degreasing, washing with water, micro-etching, washing with water, predipping, blackening, washing with water and drying. When the second process is employed, the following treatments are carried out: alkali degreasing, washing with water, acid degreasing, washing with water, micro-etching, washing with water, predipping, blackening, washing with water, reducing, washing with water, rust preventing, washing with water and drying. Further, when the third process is employed, alkali degreasing, washing with water, acid degreasing, washing with water, micro-etching, washing with water, predipping, catalyst provision, washing with water, catalyst activation, washing with water, electroless copper plating, washing with water, washing with acid, washing with water, rust preventing, washing with water and drying (see FIG. 1).

Unfortunately, the first process encounters a serious problem. More particularly, copper oxide is generally dissolved in acid. Thus, when the copper oxide of the copper conductive pattern layer is exposed on an inner surface of the through-holes due to formation of the through-holes, dipping of the copper conductive pattern layer in an etching solution or etchant during the subsequent electroplating causes the copper oxide to react with sulfuric acid in the etchant, to thereby be dissolved in the form of copper sulfate in the etchant, resulting in a defect called a pink ring occurring on the conductive pattern layer.

The second process needs to carry out reduction of the copper oxide to metallic copper after formation of the oxide, leading to an increase in the number of steps in the process. Also, it has another disadvantage of causing an increase in manufacturing cost of a printed wiring board because a reducing agent for the reduction is expensive. The third process likewise increases the number of steps.

SUMMARY OF THE INVENTION

The present invention has been made in view of the foregoing disadvantages of the prior art.

Accordingly, it is an object of the present invention to provide an etching solution or etchant which is capable of providing a copper conductive pattern layer with a roughened surface exhibiting increased acid resistance.

It is another object of the present invention to provide a method for roughening a copper surface which is capable of firmly joining a copper conductive pattern and an outer layer material to each other to reduce the number of steps in manufacturing of a printed wiring board.

It is a further of the present invention to provide a method for producing a printed wiring board which is capable of preventing a defect such as a pink ring or the like from occurring on a conductive pattern layer.

In accordance with one aspect of the present invention, an etchant is provided. The etchant includes a main component containing at least one first compound selected from the group consisting of oxo acids represented by one of the following formulae:

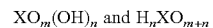

$$XO_m(OH)_n \text{ and } H_nXO_{m+n}$$

wherein X is a central atom, m is an integer of 0 or more and n is an integer of 1 or more and derivatives thereof and at least one second compound selected from the group consisting of peroxides and derivatives thereof; and an auxiliary component containing at least one azole and at least one halide.

In a preferred embodiment of the present invention, the integer m in the above-described formulae is 2 or more.

In a preferred embodiment of the present invention, the integer m+n in the above-described formulae is 4 or more.

The oxo acids suitable for use in the present invention typically include sulfuric acid ($H_2SO_4$). Also, the oxo acids may further include nitric acid ($HNO_3$), boric acid ($H_3BO_3$), perchloric acid ($HClO_4$), chloric acid ($HClO_3$), phosphoric acid ($H_3PO_4$) and the like. The oxo acid derivatives may include 2-hydroxyethane-1-sulfonic acid ($HOC_2H_4SO_3H$), methanesulfonic acid ($CH_3SO_3H$), aminosulfonic acid ($NH_2SO_3H$), hydroxybenzenesulfonic acid ($HOC_6H_4SO_3H$), nitrobenzenesulfonic acid ($NO_2C_6H_4SO_3H$), p-aminobenzenesulfonic acid ($NH_2C_6H_4SO_3H$) and the like.

The concentration of an oxo acid or derivative thereof in the etchant of the present invention is selected in view of the degree of the resultant roughness of the copper surface. If the concentration of the oxo acid or derivative thereof is too low or too high, the copper surface cannot be provided with sufficient irregularities. For example, for sulfuric acid ($H_2SO_4$), the concentration thereof is preferably 40 to 300 g/l, and more preferably 65 to 200 g/l; for 2-hydroxyethane-1-sulfonic acid ($HOC_2H_4SO_3H$), the concentration thereof is preferably 60 to 300 g/l, and more preferably 100 to 250 g/l; for aminosulfonic acid ($NH_2SO_3H$), the concentration thereof is preferably 45 to 160 g/l, and more preferably 60 to 150 g/l; and for methanesulfonic acid ($CH_3SO_3H$), the concentration thereof is preferably 60 to 300 g/l, and more preferably 60 to 180 g/l, respectively.

The peroxides may typically include hydrogen peroxide ($H_2O_2$), and the peroxide derivatives may include peroxo acids, peroxonates and the like. In particular, hydrogen peroxide, peroxomono acid or a salt thereof are preferably used as the peroxide or derivative thereof. The peroxo acids may include peroxomonosulfuric acid ($H_2SO_5$), peroxonitric acid ($HNO_4$), peroxomonophosphoric acid ($H_3PO_5$), peroxochromic acid ($H_3CrO_8$), peroxoboric acid ($HBO_3$, $HBO_4$, $HBO_5$) and the like. The peroxonates may include potassium peroxomonosulfate ($K_2SO_5$), potassium hydrogenperoxosulfate ($KHSO_5$), potassium peroxonitrate ($KNO_4$), sodium peroxomonophosphate ($Na_3PO_5$), sodium peroxochromate ($Na_3CrO_8$), sodium perborate ($NaBO_3$, $NaBO_4$, $NaBO_5$) and the like.

The concentration of a peroxide or derivative thereof in the etchant of the present invention is a concentration which allows a suitable etching rate to be exhibited. If the concentration of the peroxide or derivative thereof is too low, the etching rate is too low to be of practical use; and if it exceeds a certain value, the etching rate is too high to control. For example, for hydrogen peroxide ($H_2O_2$), the concentration thereof is preferably 20 to 200 g/l, and more preferably 40 to 80 g/l; and for potassium peroxomonosulfate ($K_2SO_5$), the concentration thereof is preferably 60 to 300 g/l, and more preferably 120 to 250 g/l, respectively.

Also, the etchant includes an auxiliary component containing at least one azole and at least one halide. The azoles may include triazole, pyrrole, oxazole, thiazole and the like. The triazoles and derivatives thereof may include benzotriazole (BTA), 5-methylbenzotriazole and the like. The azole concentration in the etchant of the present invention is a concentration sufficient to provide a copper surface with irregularities. If the azole concentration is too low, sufficient etching capability cannot be exhibited; and if it exceeds a certain value, a degree of surface roughening does not vary. For example, the concentration of benzotriazole (BTA) used as the azole in the etchant is preferably 0.1 to 20 g/l, and more preferably 1 to 10 g/l.

The halides may typically include chlorides such as hydrochloric acid, hydrochloride and the like. The chlorides may include sodium chloride (NaCl), potassium chloride (KCl), stannous chloride ($SnCl_2$) and the like. The halide concentration in the etchant of the present invention is a concentration sufficient to provide a copper surface with irregularities. If the halide concentration is too low, a degree of surface roughening is too low; and if it exceeds a certain value, a degree of surface roughening instead is decreased. When a chloride such as sodium chloride (NaCl), potassium chloride (KCl), stannous chloride ($SnCl_2$) or the like is used as the halide in the etchant, the chloride concentration is selected so that the chlorine concentration in the etchant may be preferably 0.0006 to 1.21 g/l, and more preferably 0.006 to 0.182 g/l. For example, the concentration of sodium chloride (NaCl) used as the halide in the etchant is preferably 0.001 to 2 g/l, and more preferably 0.01 to 0.3 g/l.

In accordance with another aspect of the present invention, a method for roughening a copper surface is provided. The method comprises the step of subjecting the copper surface to etching using an etchant so that the copper surface is provided with acicular protrusions. The etchant includes a main component containing at least one first compound selected from the group consisting of oxo acids represented by one of the following formulae:

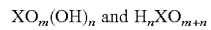
$$XO_m(OH)_n \text{ and } H_nXO_{m+n}$$

wherein X is a central atom, m is an integer of 0 or more and n is an integer of 1 or more and derivatives thereof and at least one second compound selected from the group consisting of peroxides and derivatives thereof. Also, the etchant further includes an auxiliary component containing at least one azole and at least one halide.

In accordance with a further aspect of the present invention, a method for producing a printed wiring board using an inner layer material having an insulating layer on which a copper foil layer is laminated is provided. The method comprises the steps of roughening a surface of the copper foil layer of the inner layer material by an etchant, subjecting the roughened copper foil layer to patterning to form a copper conductive pattern layer, and then laminating an insulating outer layer material on a surface of the copper conductive pattern layer. The etchant includes a main component containing at least one first compound selected from the group consisting of oxo acids represented by one of the following formulae:

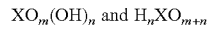
$$XO_m(OH)_n \text{ and } H_nXO_{m+n}$$

wherein X is a central atom, m is an integer of 0 or more and n is an integer of 1 or more and derivatives thereof and at least one second compound selected from the group consisting of peroxides and derivatives thereof. The etchant further includes an auxiliary component containing at least one azole and at least one halide.

In a preferred embodiment of the present invention, a degreasing treatment and a predip treatment are conducted prior to the roughening step using the etchant.

The etchant of the present invention, when copper is dipped therein, permits the auxiliary agent to form a carrier layer on a surface of the copper. Also, it permits copper to be selectively dissolved in the form of copper ions from crystal defects on the copper surface, resulting in electrons being discharged. The discharged electrons are then fed to the peroxide through the carrier layer, leading to reduction of the peroxide and formation of water on an interface between the carrier layer and the etchant. Thus, a concentration gradient of copper ions occurs across the carrier layer in such a manner that the concentration is increased near the copper and reduced near the etchant, to thereby exhibit a function as a local cell. This would result in copper being selectively dissolved from the deepest or deepmost portion of the copper surface at which a concentration of copper ions is increased, leading to formation of irregularities on the copper surface.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein:

FIGS. 9A and 9B to 15A and 15B are photographs of electromicroscopic images of respective surfaces of copper-clad laminates which were subjected to etching by etchants prepared in Examples 4 to 10 of the present invention.

DETAILED DESCRIPTION OF THE PREFERRED EMBODIMENT

Now, the present invention will be described hereinafter with reference to the accompanying drawings.

Figure 2:
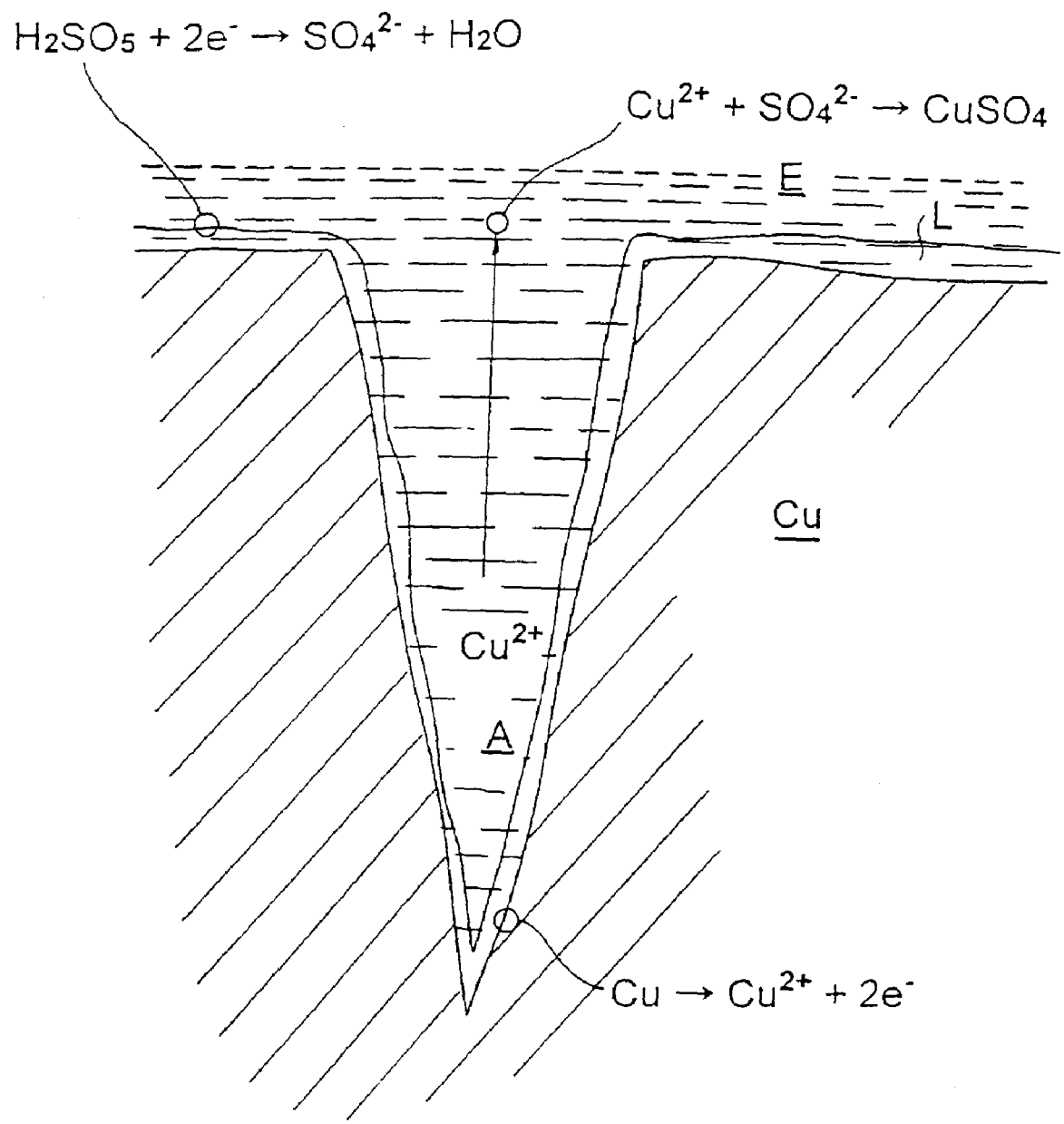
FIG. 2 is a schematic view showing a mechanism of etching by an etching solution or etchant according to an embodiment of the present invention.

Referring first to FIG. 2, a manner of etching of copper taking place when it is dipped in an etching solution or etchant according to an embodiment of the present invention is schematically illustrated. The etchant includes a main component containing at least one first compound selected from the group consisting of oxo acids represented by one of the following formulae:

$$XO_m(OH)_n \text{ and } H_nXO_{m+n}$$

wherein X is a central atom such as S, P, N or the like, m is an integer of 0 or more and n is an integer of 1 or more and derivatives thereof and at least one second compound selected from the group consisting of peroxides and derivatives thereof. Also, the etchant includes an auxiliary component containing at least one azole. In addition, the etchant may include at least one halide. In the illustrated embodiment, sulfuric acid ($H_2SO_4$), hydrogen peroxide ($H_2O_2$), benzotriazole (BTA) and chlorine in the form of sodium chloride (NaCl) are used as the oxo acid, peroxide, azole and halide, respectively.

A mechanism of etching of a copper surface by the etchant of the illustrated embodiment is supposed as follows:

As shown in FIG. 2, when copper Cu is dipped in the etchant E, benzotriazole permits a carrier layer L containing chlorine ions to be formed on a surface of the copper. Sulfuric acid ($H_2SO_4$) is oxidized by hydrogen peroxide ($H_2O_2$) in the etchant E, resulting in peroxomonosulfuric acid ($H_2SO_5$) being produced according to the following reaction formula:

$$H_2SO_4 + H_2O_2 \rightarrow H_2SO_5 + H_2O$$

The copper Cu is selectively dissolved in the form of a copper ion from a number of crystal defects existing on the surface thereof into the etchant E to discharge electrons according to the following formula:

$$Cu \rightarrow Cu^{2+} + 2e^-$$

The discharged electrons are fed through the carrier layer L to the peroxomonosulfuric acid to reduce the peroxomonosulfuric acid according to the following formula:

$$H_2SO_5 + 2e^- \rightarrow SO_4^{2-} + H_2O$$

This results in water being produced on an interface between the carrier layer L and the etchant E. As stated above, corrosion occurs on the crystal defects or grain boundaries of the copper due to effects of the azole, while chlorine ions ($Cl^-$) protect the surface of the copper and prevent corrosion except on the grain boundaries. Thus, the carrier layer L keeps the surface of the copper Cu statically determinate or stationary and functions as a mediation layer for the electrons to regulate a direct reaction between the copper Cu and the peroxomonosulfuric acid ($H_2SO_5$).

The carrier layer L has a concentration gradient of the copper ions occurring therein due to water produced on the interface between the carrier layer L and the etchant E, wherein the concentration is increased near the copper Cu and reduced near the etchant E. Also, flowing of the etchant E is minimized in the deepest or deepmost portion of each of defects indicated at A in FIG. 2, so that an action as a local cell is promoted in the deepmost portion A, leading to deep etching of the copper surface, resulting in the copper surface being roughened to have steep irregularities.

As described above, the etchant of the illustrated embodiment permits acid-insoluble irregularities to be formed on the surface of the copper Cu. This permits a copper conductive pattern and an outer layer material such as resin to be firmly joined or bonded to each other in manufacturing of a printed circuit board or the like and eliminates a necessity of any treatment such as soft etching or the like, to thereby reduce the number of steps in the manufacturing.

Figure 3:
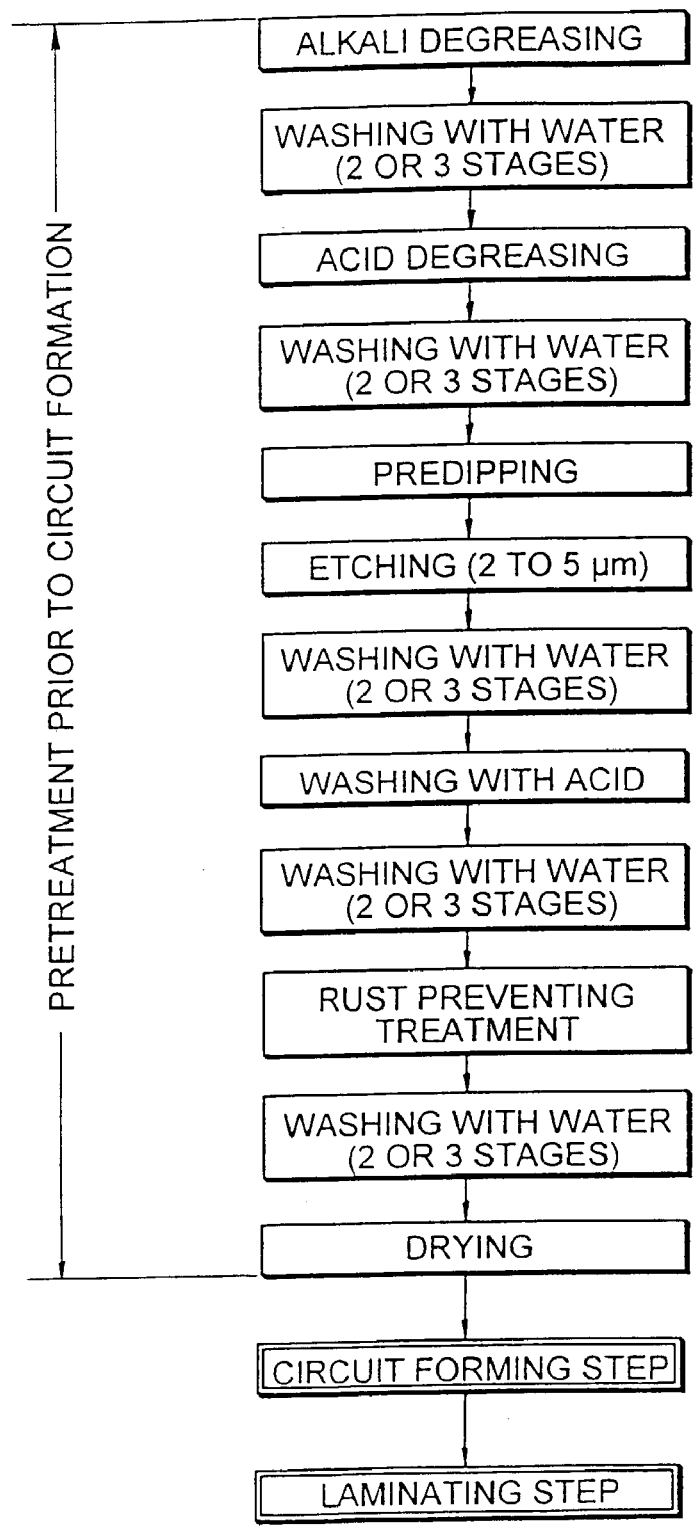
FIG. 3 is a flowchart showing a method for producing a printed wiring board according to an embodiment of the present invention.

Reference is made to FIG. 3 which is a flowchart showing a method for producing a printed wiring board according to an embodiment of the present invention.

In this embodiment, using an inner layer material which is made by laminating a copper foil on a surface of a plate made of resin such as epoxy resin or the like, a printed wiring board is produced through a preliminary treatment step prior to circuit formation, a circuit formation step such as patterning and the like, a laminating step of an outer layer material, and a through-hole formation step and the like as shown in FIG. 3. In the preliminary treatment step prior to the circuit formation, the inner layer material is subjected to treatments such as alkali degreasing, washing with water, acid degreasing, washing with water, predipping, etching, washing with water, washing with acid, washing with water, rust preventing, washing with water and drying.

In this instance, the preliminary treatment step prior to the circuit formation, the laminating step and the through-hole formation step are known in the above described prior art. And the treatments such as alkali degreasing, acid degreasing, predipping, washing with acid, rust preventing and drying can also be replaced by known treatments, descriptions for such steps and treatments will be omitted.

In the etching treatment of the preliminary treatment step prior to the circuit formation, a surface of the copper foil of the inner layer material is etched by dipping the inner layer material into an etchant which was prepared by compounding sulfuric acid ($H_2SO_4$) as oxo acid, hydrogen peroxide ($H_2O_2$) as peroxide, sodium chloride (NaCl) as chlorine and benzotriazole (BTA) as azole, respectively.

As the result of the etching treatment using such an etchant, the copper surface is roughened to have acid-insoluble steep irregularities. Therefore, in the subsequent laminating step, an outer layer material such as resin or the like can be firmly joined to a copper conductive pattern. Further, a copper oxide and the like are not produced, and therefore a defect called a pink ring does not occur during electroplating after forming of through-holes.

Figure 1:
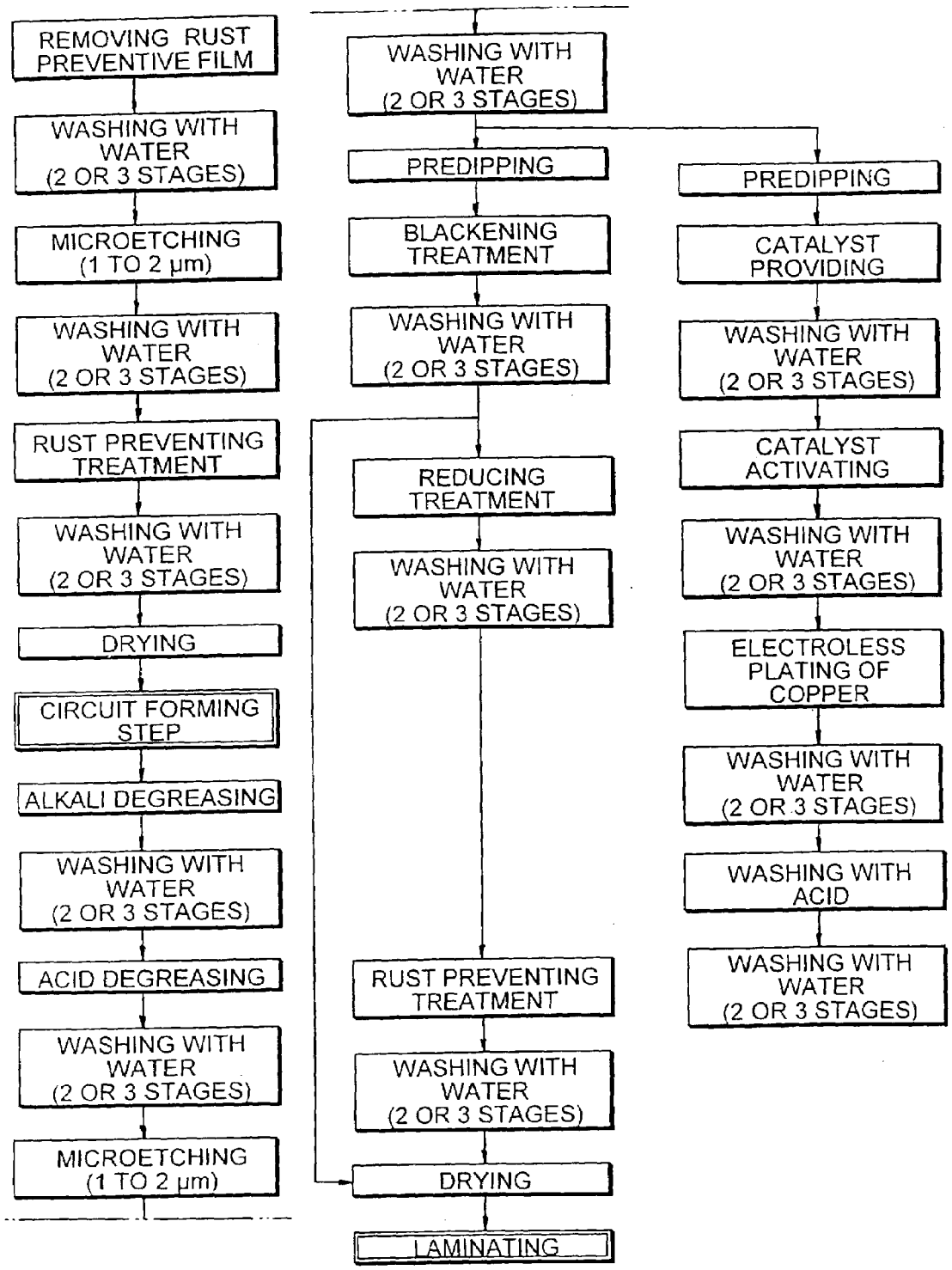
FIG. 1 is a flowchart showing a conventional method for producing a printed wiring board.

In this embodiment, as is apparent from comparison of the flowcharts of FIGS. 1 and 3, treatments such as rust prevention is unnecessary between the circuit formation and the laminating step, and therefore, the number of process steps or treatments can be reduced, resulting in that the manufacturing cost of the printed wiring board can be reduced as well as the time required for manufacturing can be shortened.

The invention will be understood more readily with reference to the following examples; however, these examples are intended to illustrate the invention and are not to be construed to limit the scope of the invention.

EXAMPLE 1

First, a first aqueous etching solution or etchant having such a composition as shown in Table 1 described below was prepared.

TABLE 1

| (Temperature: 20° C.) | |
| --- | --- |
| $H_2O_2$ | 25 g/l |
| $H_2SO_4$ | 90 g/l |

A surface of a copper-clad laminate made of epoxy resin filled with a glass fabric was dipped in the thus-prepared etchant for 1 minute to remove a rust preventive film from the surface. Then, the laminate was dipped for 5 minutes in a second etching solution or etchant having such a composition as shown in Table 2 described below, to thereby be subjected to etching, resulting in the surface of the laminate being roughened.

TABLE 2

| (Temperature: 25° C.) | |
| --- | --- |
| $H_2O_2$ | 80 g/l |
| $H_2SO_4$ | 90 g/l |
| BTA | 5 g/l |
| NaCl | 0.2 g/l |

Figure 4A:
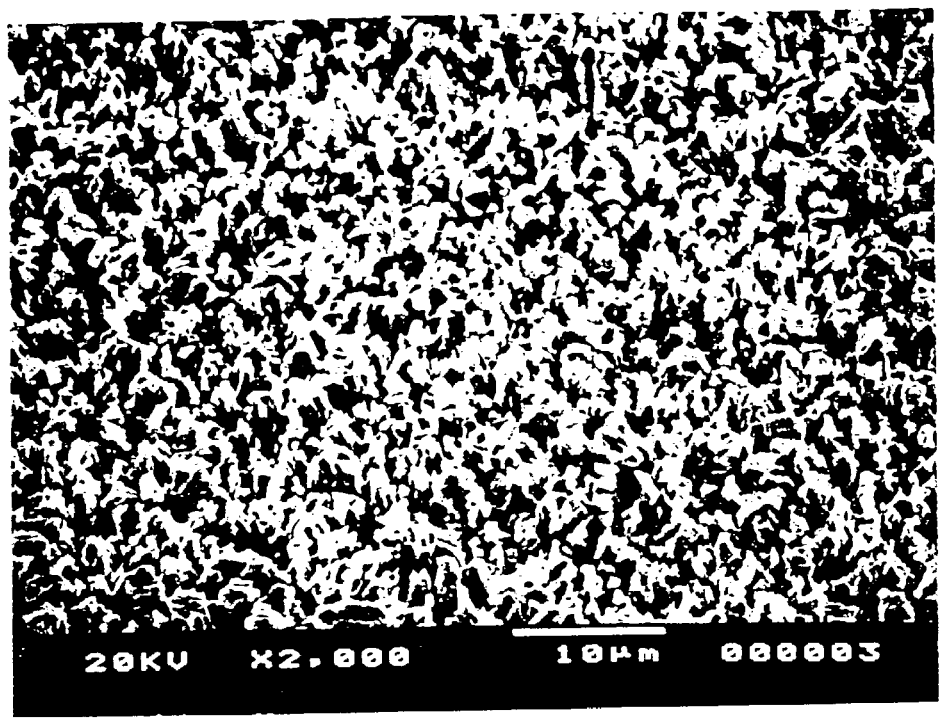
FIGS. 4A and 4B are photographs of electromicroscopic images of a surface of a copper-clad laminate which was subjected to etching by an etchant prepared in Example 1 of the present invention.
Figure 4B:
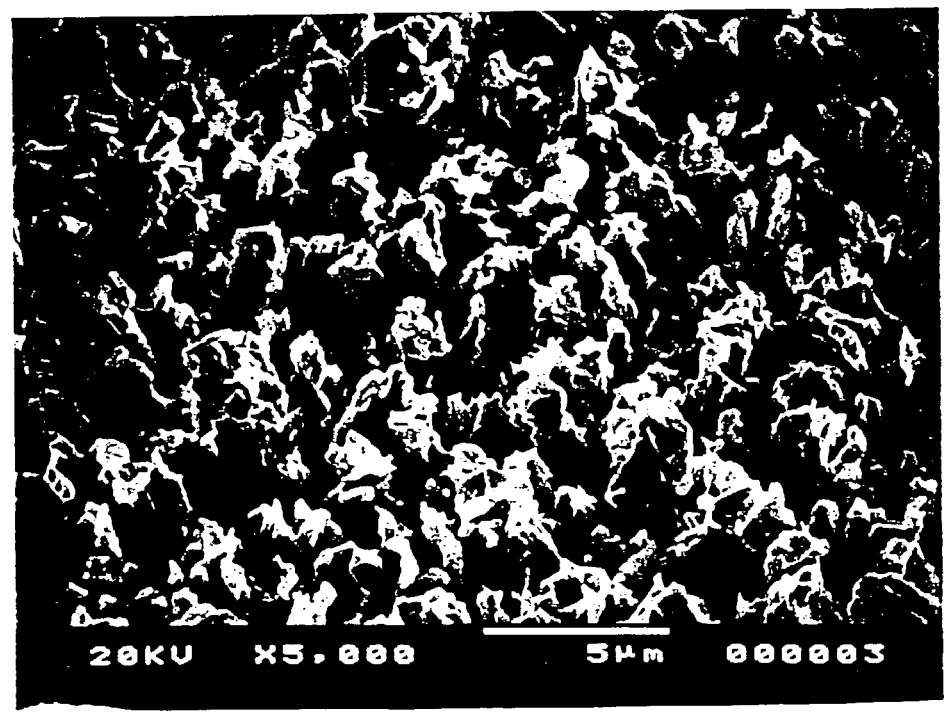
Figure 5A:
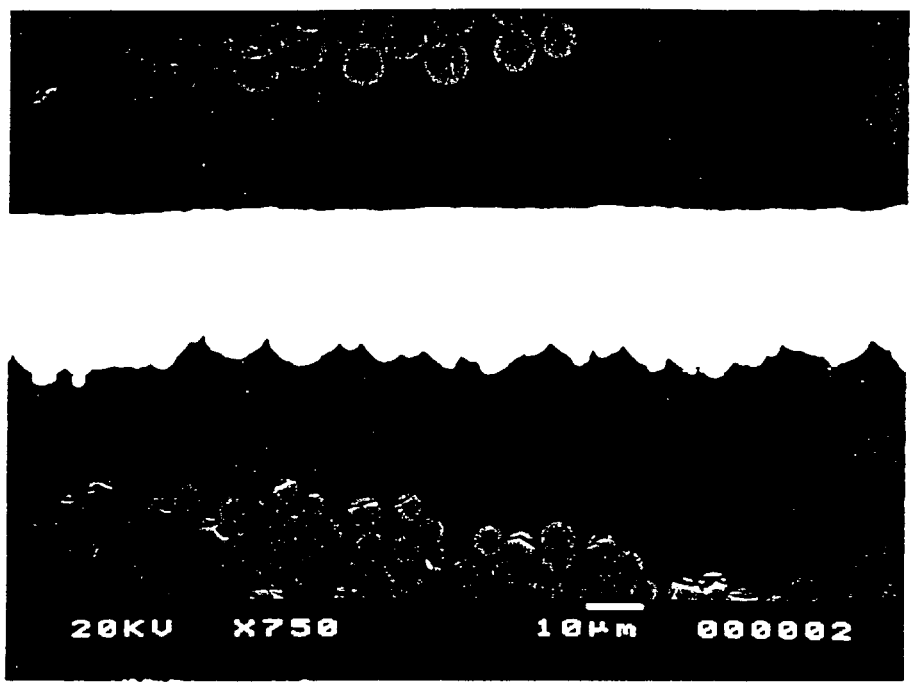
FIG. 5A is a photograph of an electromicroscopic image of a section of a copper-clad laminate prior to etching in Example 1 of the present invention.
Figure 5B:
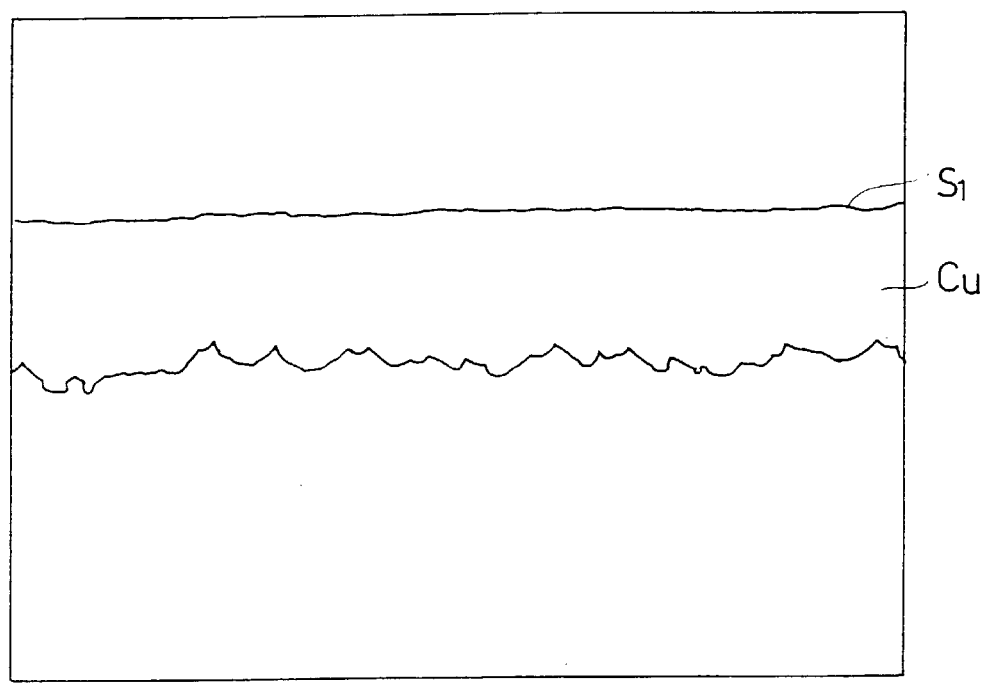
FIG. 5B is an illustrative view of the photograph in FIG. 5A.
Figure 6A:
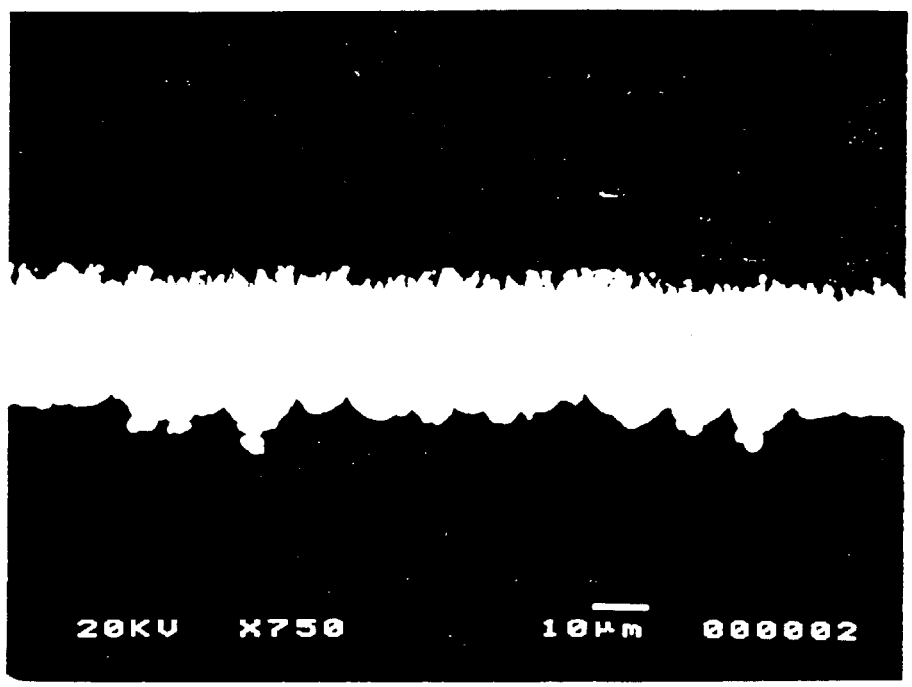
FIG. 6A is a photograph of an electromicroscopic image of a section of a copper-clad laminate after etching in Example 1 of the present invention.
Figure 6B:
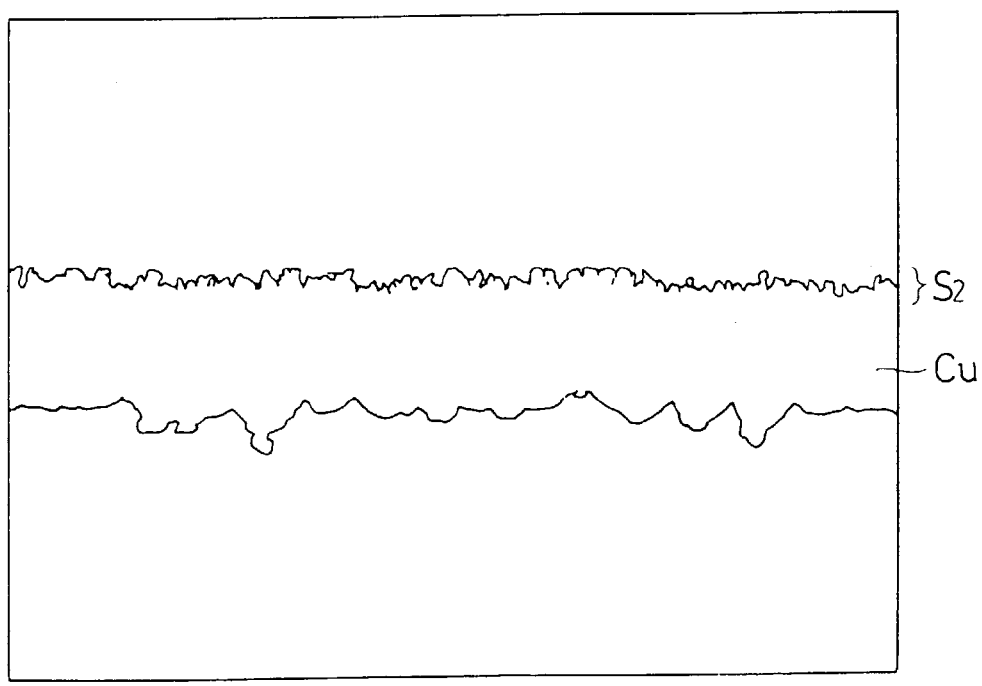
FIG. 6B is an illustrative view of the photograph in FIG. 6A.

Then, the copper surface of the copper-clad laminate thus etched was observed by means of a scanning electron microscope (SEM). As a result, it was found that the surface is formed thereon with fine acicular protrusions as shown in FIGS. 4A and 4B. Also, a section of the copper-clad laminate was observed before and after the etching. As a result, it was found that the surface ($S_1$) prior to the etching is flat as shown in FIGS. 5A and 5B, whereas the surface ($S_2$) after the etching was roughened as shown in FIGS. 6A and 6B. Thus, it was confirmed that the surface is satisfactorily roughened.

Then, the copper-clad laminate having the surface thus roughened was dipped in hydrochloric acid (1:1). However, no discoloration and dissolution of the roughened copper surface was observed, thus, it was confirmed that it exhibits increased acid resistance.

EXAMPLE 2

A surface of a copper-clad laminate made of epoxy resin filled with a glass fabric was dipped in the etchant shown in Table 1 for 1 minute to remove a rust preventive film from the surface as in the Example 1. Then, the laminate was dipped for 5 minutes in a third etching solution or etchant having such a composition as shown in Table 3 described below, resulting in the surface of the laminate being roughened.

TABLE 3

| (Temperature: 25° C.) | |
| --- | --- |
| $K_2SO_5$ | 250 g/l |
| $H_2SO_4$ | 90 g/l |
| BTA | 5 g/l |
| NaCl | 0.2 g/l |

As will be noted from Tables 2 and 3, the third etchant was substantially the same as the second etchant except that potassium peroxomonosulfate ($K_2SO_5$) was substituted for hydrogen peroxide ($H_2O_2$).

Figure 7A:
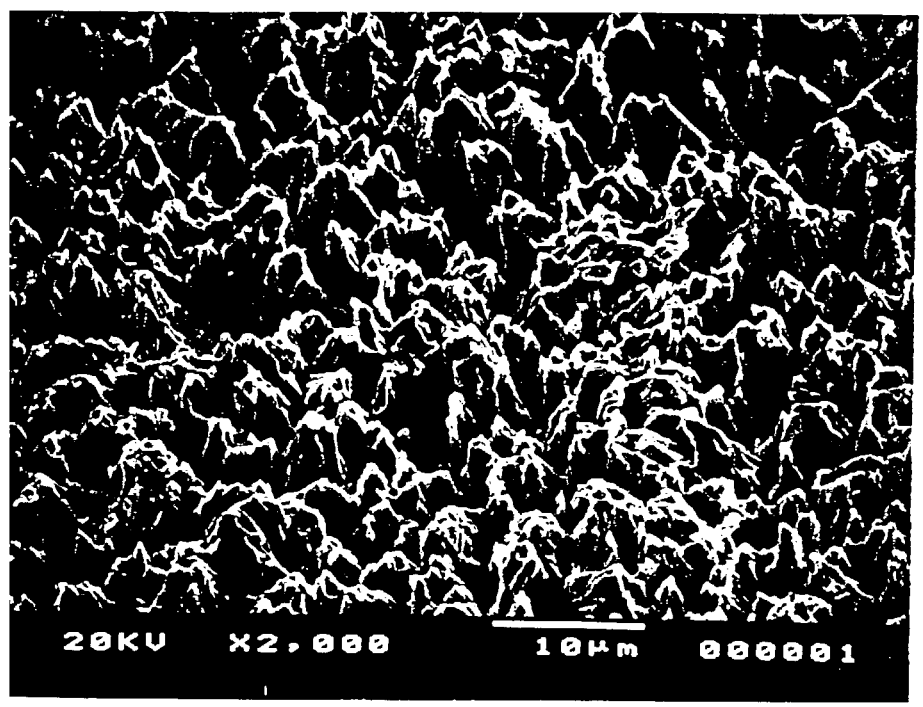
FIGS. 7A and 7B are photographs of electromicroscopic images of a surface of a copper-clad laminate which was subjected to etching by an etchant prepared in Example 2 of the present invention.
Figure 7B:
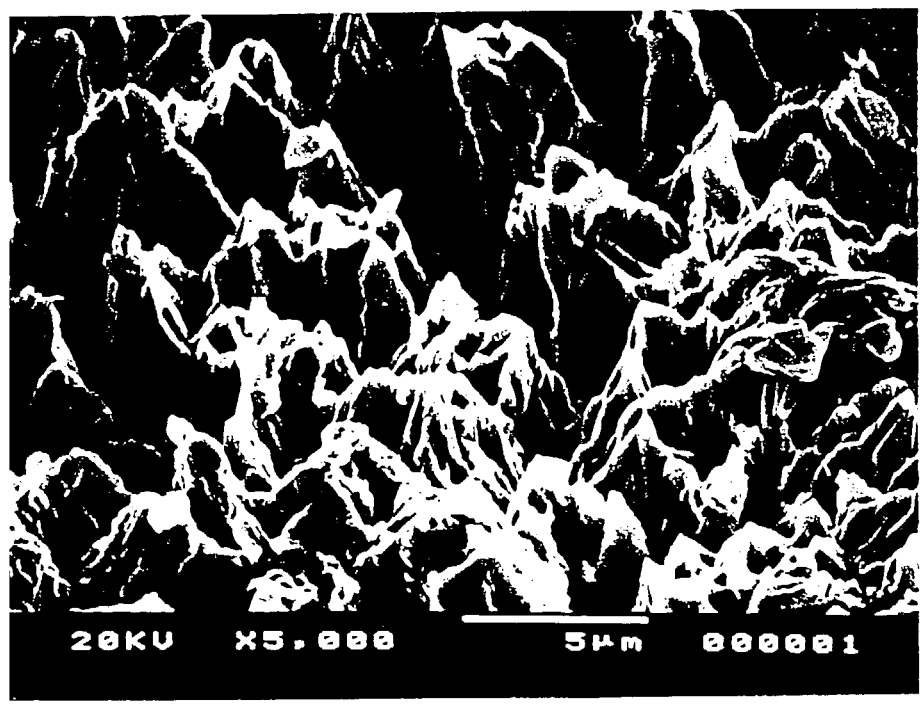

The copper surface was likewise subjected to SEM observation. As a result, it was found that the surface is formed thereon with such protrusions as shown in FIGS. 7A and 7B, resulting in being roughened. Comparison of Example 2 with Example 1 indicated that roughening of the copper surface in Example 2 is somewhat decreased and non-uniform as compared with that in Example 1. This would be due to that compounds such as potassium peroxodisulfate ($K_2S_2O_8$) and the like were incorporated in potassium peroxomonosulfate ($K_2SO_5$).

Then, the copper-clad laminate having the surface thus roughened was dipped in hydrochloric acid (1:1). However, no discoloration and dissolution of the roughened copper surface was observed, thus, it was confirmed that it exhibits increased acid resistance as in Example 1.

EXAMPLE 3

A surface of a copper-clad laminate made of epoxy resin filled with a glass fabric was dipped for 1 minute in the etchant shown in Table 1 to remove a rust preventive film from the surface as in Examples 1 and 2 described above. Then, the laminate was dipped for 5 minutes in a fourth etching solution or etchant having such a composition as shown in Table 4 described below, resulting in the surface of the laminate being roughened.

TABLE 4

| (Temperature: 25° C.) | |
| --- | --- |
| $H_2O_2$ | 80 g/l |
| $HClO_4$ | 150 g/l |

TABLE 4-continued (Temperature: 25° C.)

| BTA | 5 g/l |
|---|---|
| NaCl | 0.2 g/l |

Figure 8A:
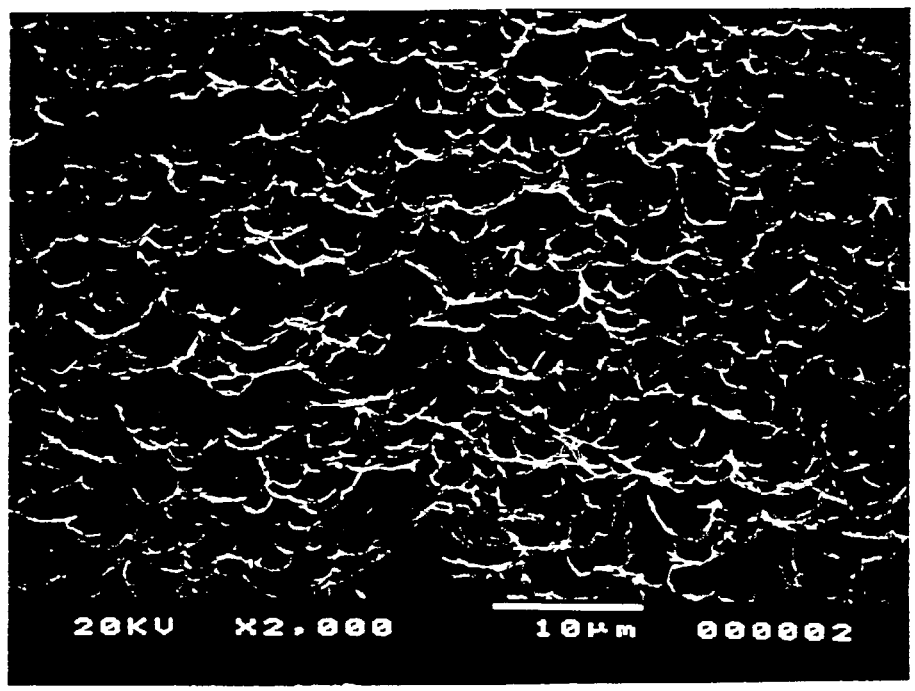
FIGS. 8A and 8B are photographs of electromicroscopic images of a surface of a copper-clad laminate which was subjected to etching by an etchant prepared in Example 3 of the present invention.
Figure 8B:
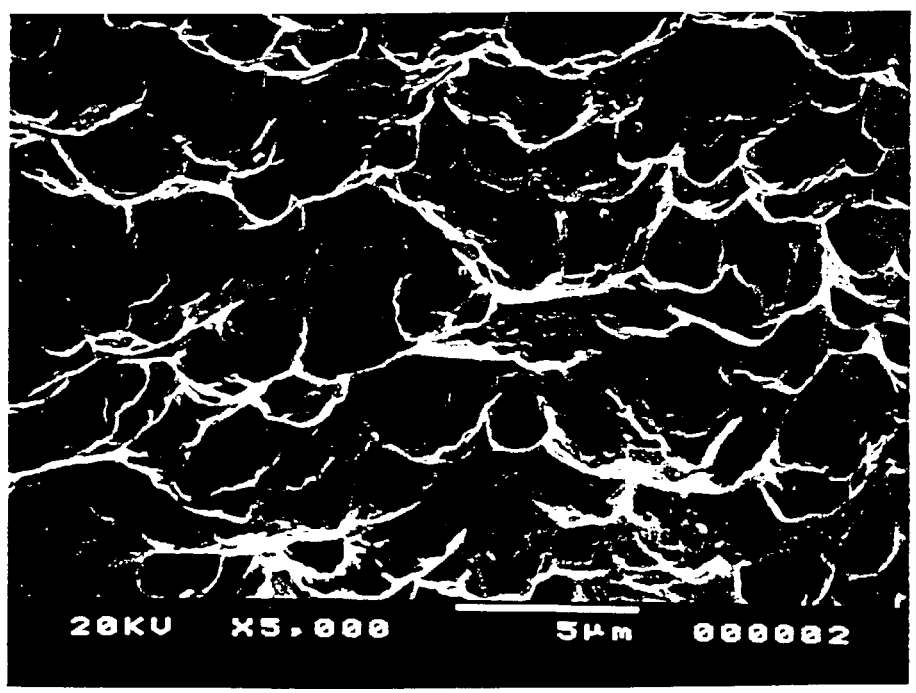
Figure 9A:
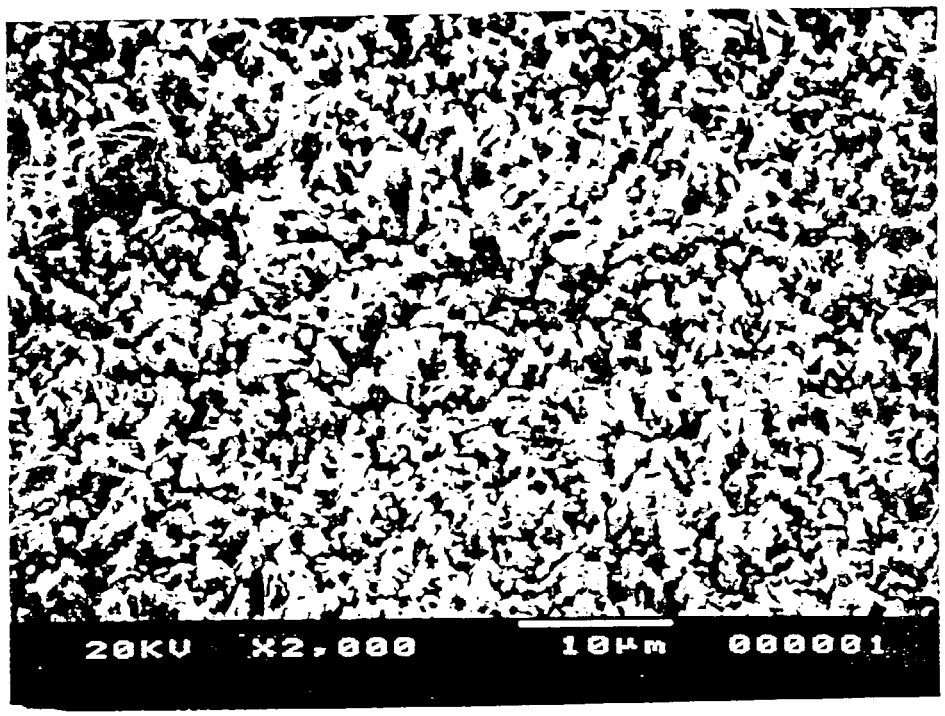
Figure 9B:
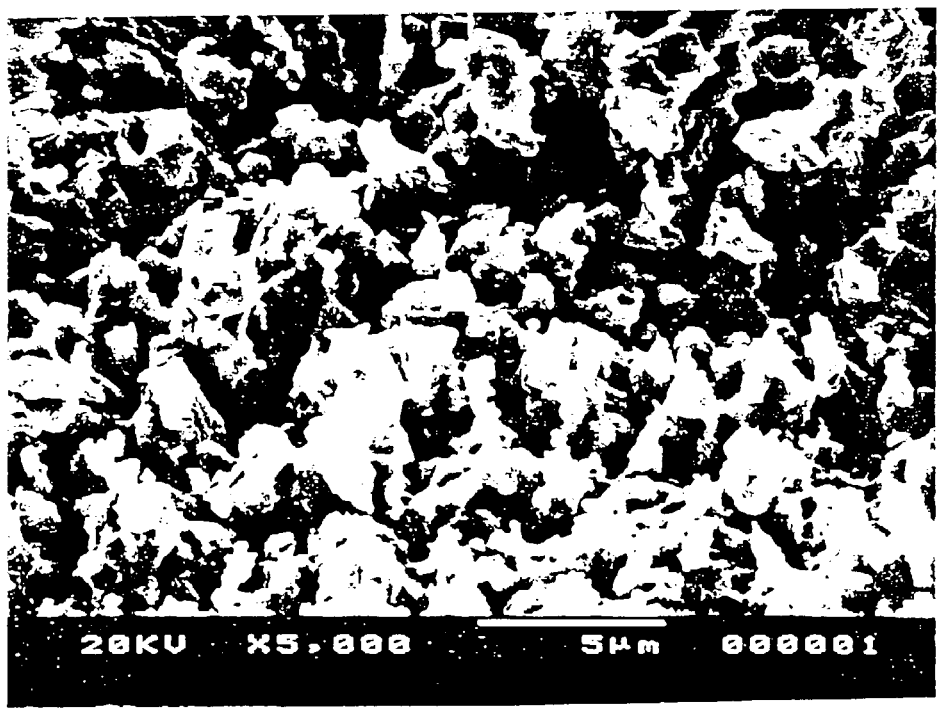
Figure 10A:
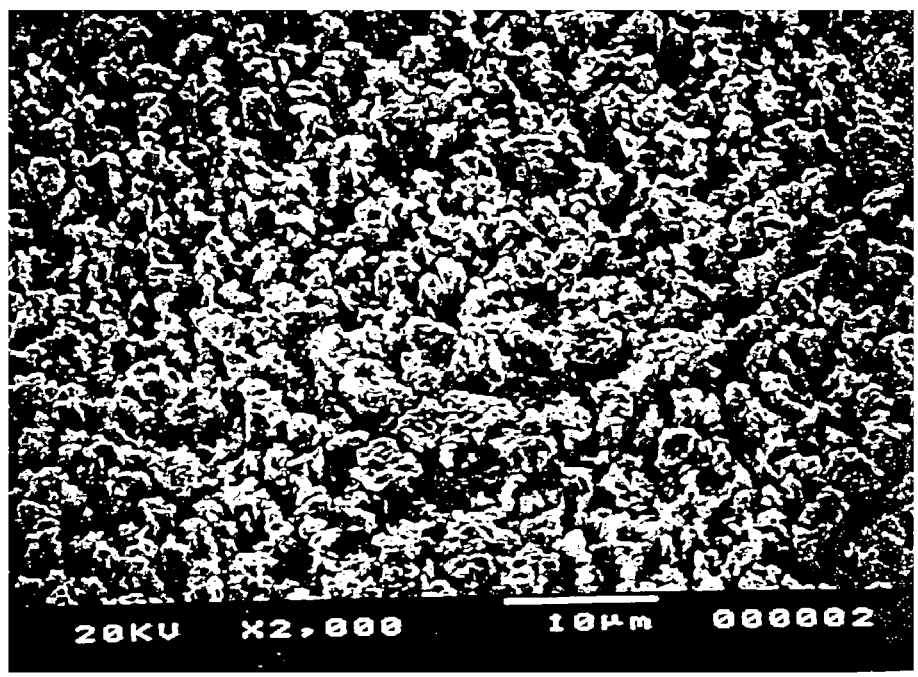
Figure 10B:
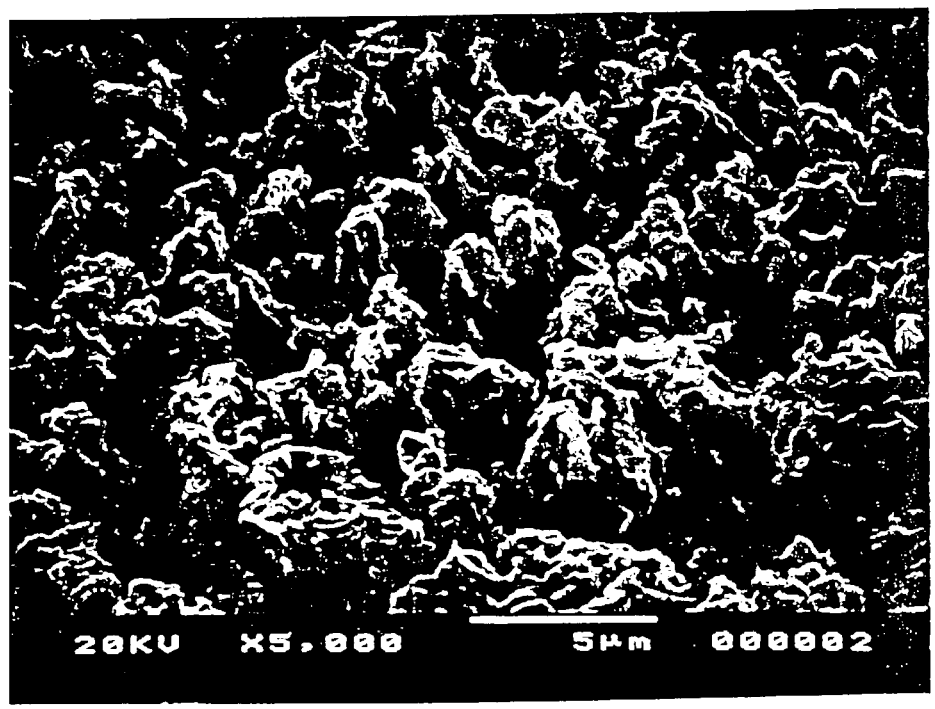
Figure 11A:
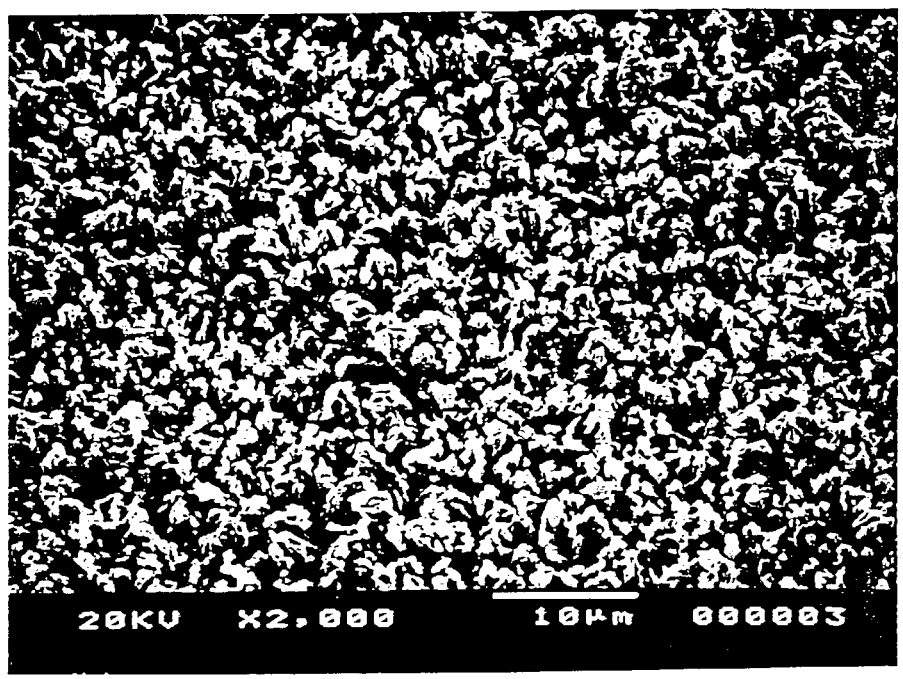
Figure 11B:
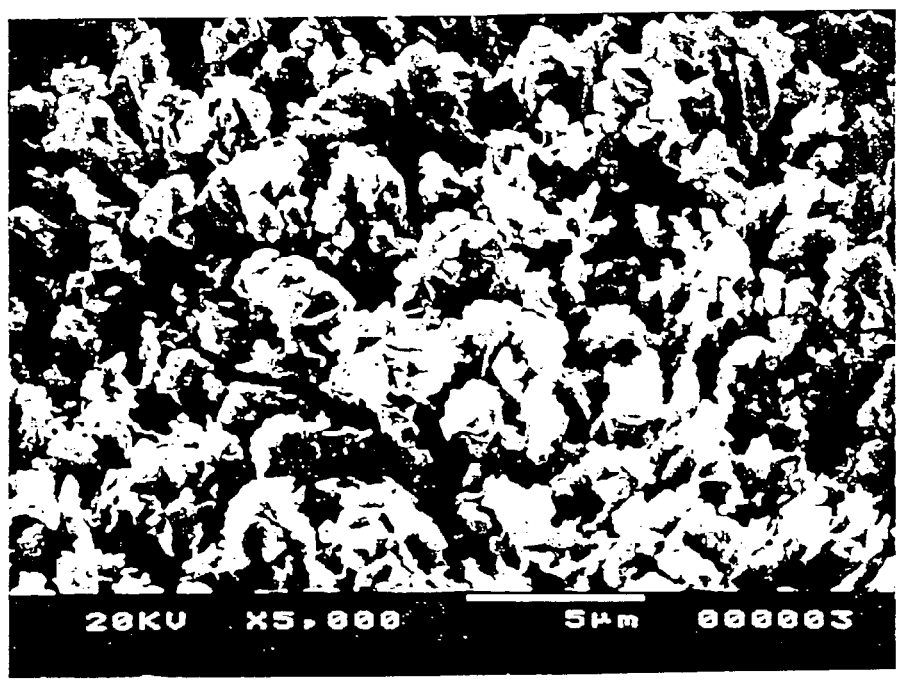
Figure 12A:
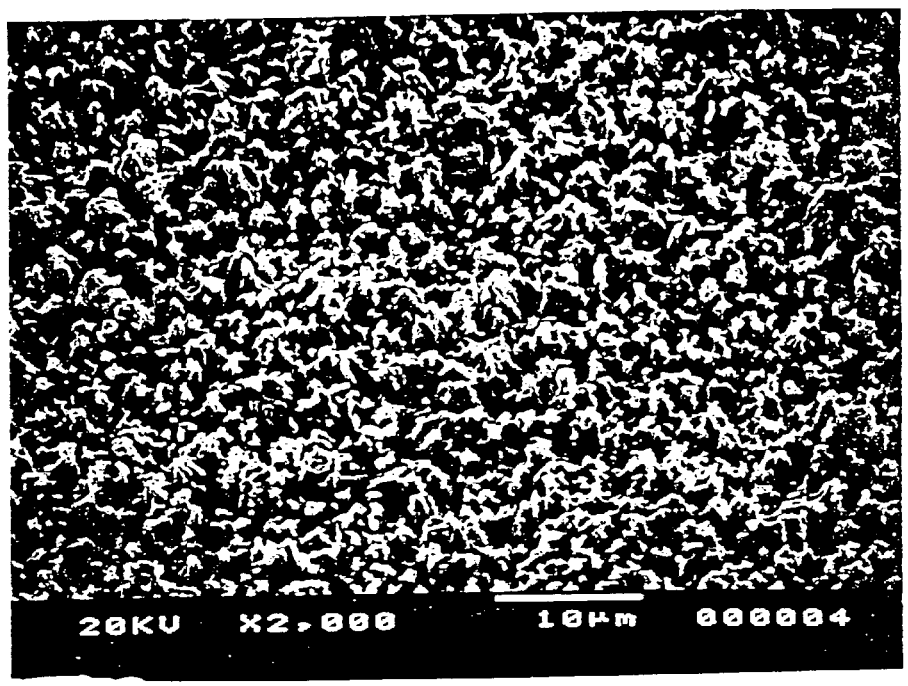
Figure 12B:
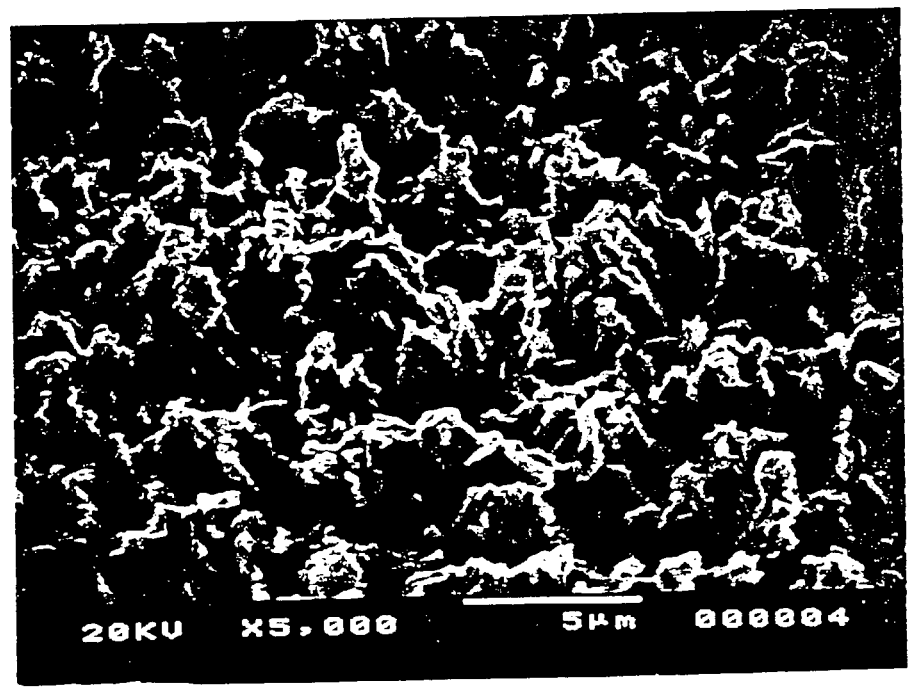
Figure 13A:
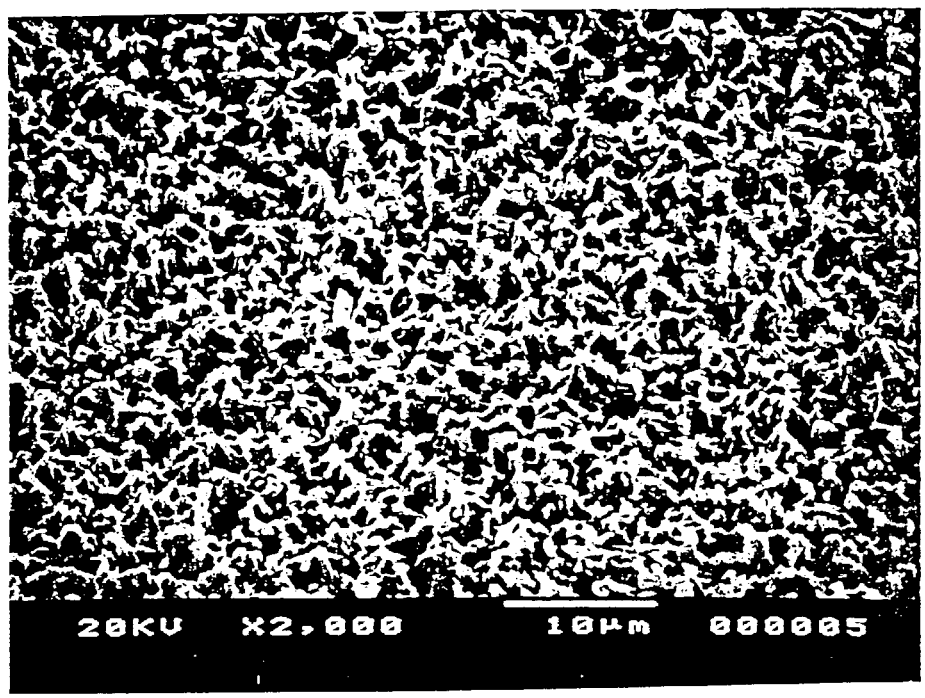
Figure 13B:
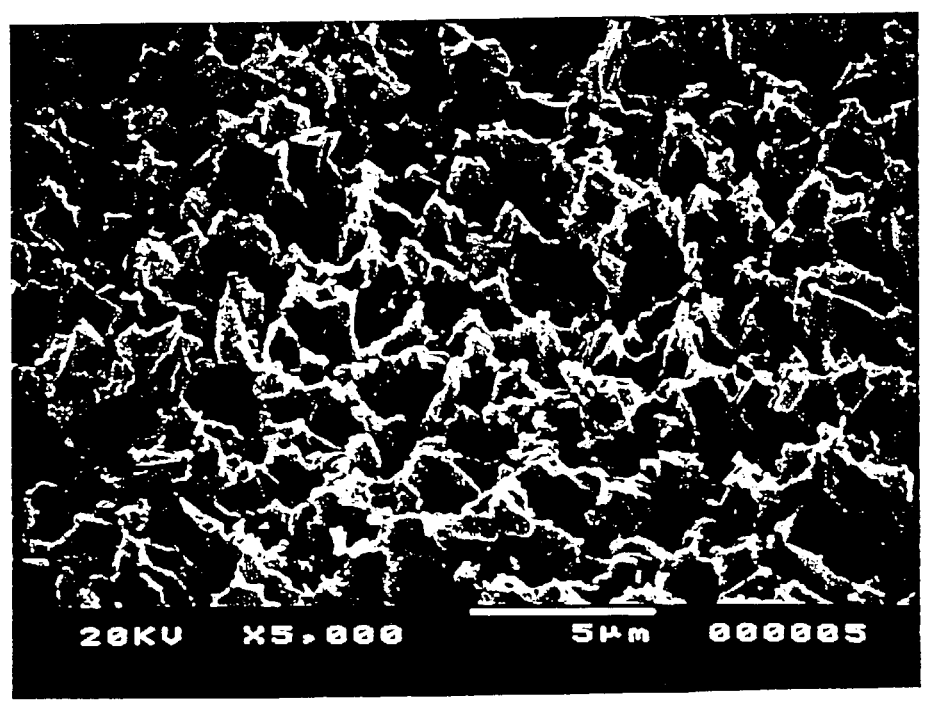
Figure 14A:
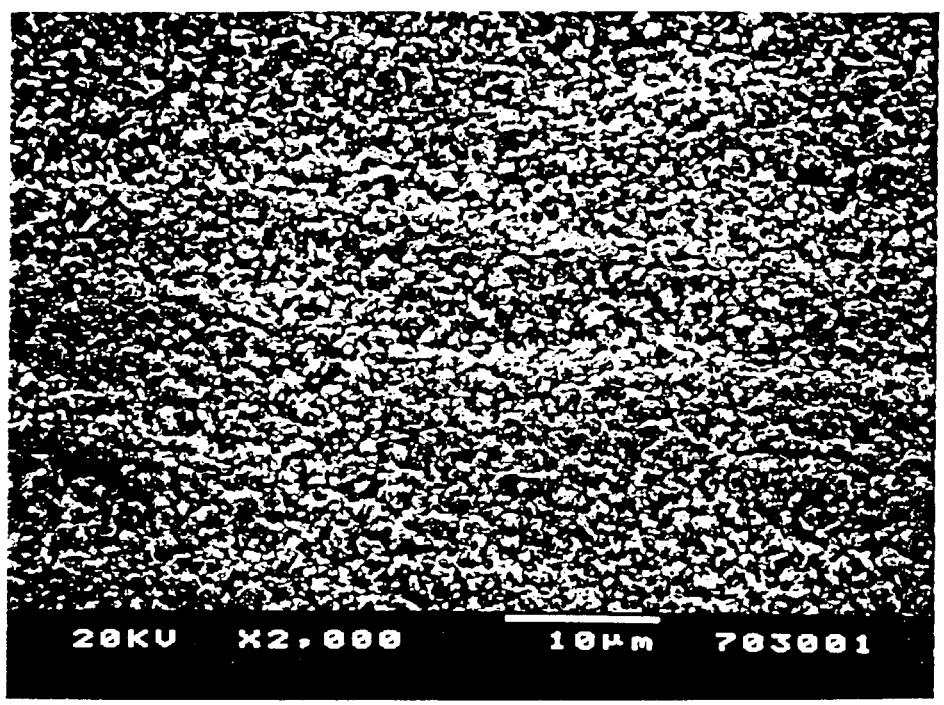
Figure 14B:
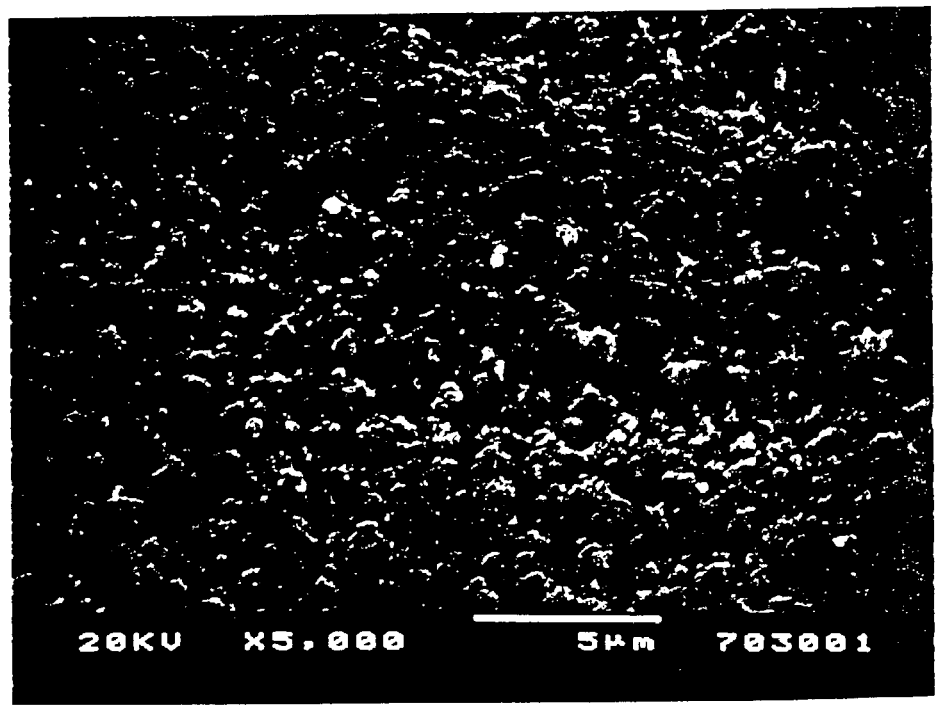
Figure 15A:
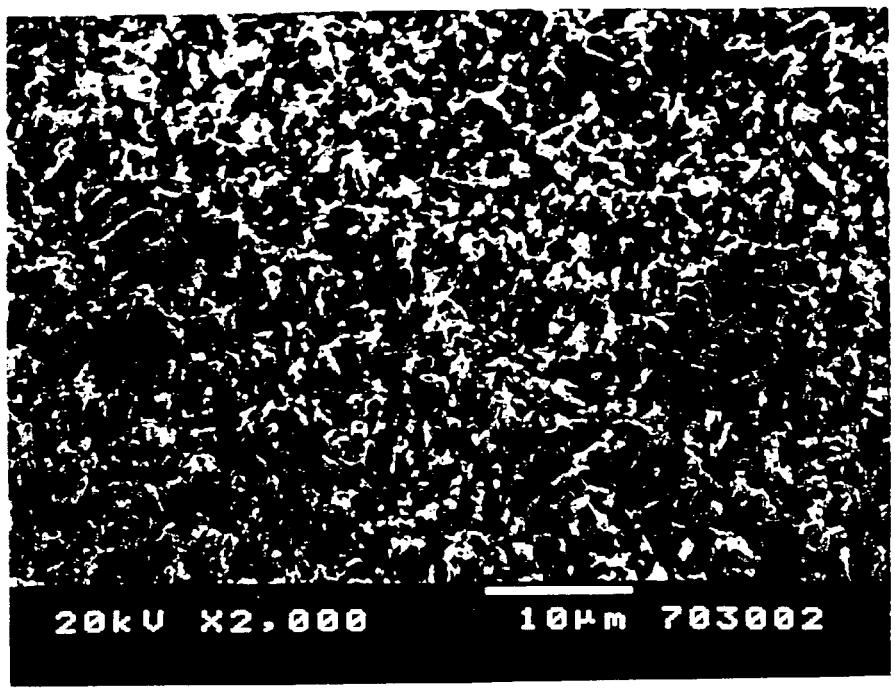
Figure 15B:
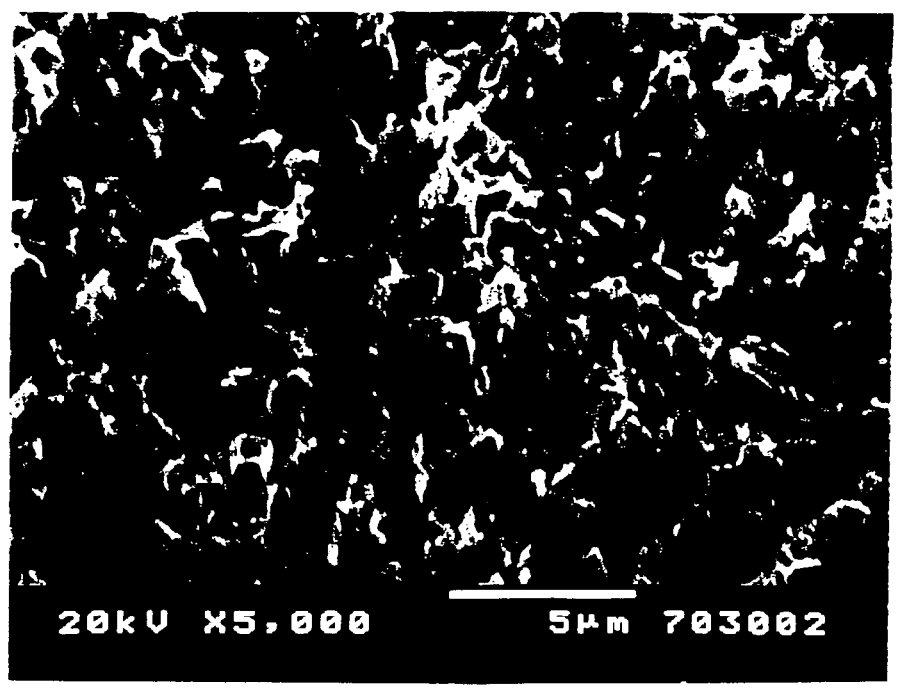

As will be noted from Tables 2 and 4, the fourth etchant was substantially the same as the second etchant except that perchloric acid ($HClO_4$) was substituted for sulfuric acid ($H_2SO_4$). The copper surface was likewise subjected to observation by means of the SEM. As a result, it was found that the surface is formed thereon with such protrusions as shown in FIGS. 8A and 8B, resulting in being roughened.

Then, the copper-clad laminate having the surface thus roughened was likewise dipped in hydrochloric acid (1:1). However, no discoloration and dissolution of the coarsened copper surface was observed, thus, it was confirmed that it exhibits increased acid resistance as in Examples 1 and 2.

In Examples 1 to 3, it will be noted that the electromicroscopic images shown in FIGS. 4A and 4B, 7A and 7B, 8A and 8B are secondary electron images, magnified 2000 times and 5000 times, respectively, which were obtained at an inclined angle of 45 degrees, and that the electromicroscopic images shown in FIGS. 5A and 6A are secondary electron images magnified 750 times, respectively, which were obtained at an inclined angle of 0 degree.

EXAMPLES 4–10

Surfaces of copper-clad laminates made of epoxy resin filled with a glass fabric were dipped for 1 minute in the etchant shown in Table 1 to remove rust preventive films from the surfaces as in Examples 1–3 described above. Then, the laminates were dipped for 5 minutes in respective etching solutions or etchants having compositions as shown in Table 5.

TABLE 5

(Temperature: 25° C.)

| Example 4 | $H_2O_2$ | 80 g/l |
|---|---|---|
| | $H_3PO_4$ | 150 g/l |
| | BTA | 6 g/l |
| | NaCl | 0.2 g/l |
| Example 5 | $H_2O_2$ | 80 g/l |
| | $NH_2SO_3H$ | 100 g/l |
| | BTA | 6 g/l |
| | NaCl | 0.2 g/l |
| Example 6 | $H_2O_2$ | 80 g/l |
| | $HOC_2H_4SO_3H$ | 130 g/l |
| | BTA | 6 g/l |
| | NaCl | 0.2 g/l |
| Example 7 | $H_2O_2$ | 80 g/l |
| | $CH_3SO_3H$ | 100 g/l |
| | BTA | 6 g/l |
| | NaCl | 0.2 g/l |
| Example 8 | $H_2O_2$ | 80 g/l |
| | $HNO_3$ | 50 g/l |
| | BTA | 6 g/l |
| | NaCl | 0.2 g/l |
| Example 9 | $H_2O_2$ | 20 g/l |
| | $H_2SO4$ | 90 g/l |
| | BTA | 6 g/l |
| | NaCl | 16 mg/l |
| Example 10 | $H_2O_2$ | 20 g/l |
| | $H_2SO_4$ | 45 g/l |
| | $H_3PO_4$ | 75 g/l |
| | BTA | 9 g/l |
| | $SnCl_2.2H_2O$ | 40 mg/l |

The copper surface of each of the laminates was likewise subjected to observation by means of the SEM. As a result, it was found that the surfaces of the laminates are respectively formed thereon with such protrusions as shown in FIGS. 9A and 9B to 15A and 15B, resulting in being roughened. In FIGS. 9A and 9B to 15A and 15B, the electromicroscopic images are secondary electron images, magnified 2000 times and 5000 times, respectively, which were obtained at an inclined angle of 45 degrees.

Then, the copper-clad laminates having the surfaces thus roughened were likewise dipped in hydrochloric acid (1:1). However, no discoloration and dissolution of the coarsened copper surface was observed, thus, it was confirmed that each of the laminates exhibits increased acid resistance.

As can be seen from the foregoing, the etchant of the present invention permits a copper surface to be formed into a roughened surface which exhibits satisfactory acid resistance and permits a copper conductive pattern and an outer layer material to be firmly joined to each other therethrough in manufacturing of a printed circuit board or the like, to thereby simplify the manufacturing.

EXAMPLE 11

A copper-clad laminate made of epoxy resin filled with a glass fabric was subjected to the treatments in order in accordance with the flowchart shown in FIG. 3, so that a test piece for examining a surface state and a test piece for measuring a peeling strength were prepared. More specifically, the predipping treatment shown in FIG. 3 was conducted by dipping in a predipping solution having a composition as shown in Table 6 for 30 seconds, and then the etching treatment was conducted by using an etchant having a composition as shown in Table 7.

TABLE 6

(Temperature: 25° C.)

| $H_2SO_4$ | 90 g/l |
|---|---|
| BTA | 6 g/l |
| NaCl | 0.2 g/l |

TABLE 7

(Temperature: 25° C.)

| $H_2OS_4$ | 90 g/l |
|---|---|
| $H_2O_2$ | 80 g/l |
| BTA | 6 g/l |
| NaCl | 0.2 g/l |

The test piece for examining the surface state was observed by means of an electron microscope. As a result, it was found that the surface was formed thereon with a large number of acicular protrusions having a height of about 5 μm, resulting in an excellent roughened surface being obtained. The peeling strength was measured using the test piece therefor. As a result, it was found that a peeling strength of 1.3 kgf/cm was obtained which is a practically sufficient strength exceeding a required peeling strength of 0.8 kgf/cm.

In the above described embodiment, the alkali degreasing, acid degreasing and predipping treatments are carried out. However, if the surface of the copper foil of the inner layer material is clean, such treatments may be omitted.

Needless to say, it is possible to replace the roughening treatments between the circuit formation step and the laminating step in the conventional manufacturing method shown in FIG. 1 by the series of roughening treatments from the alkali degreasing to the drying according to the present invention.

As can be seen the foregoing, the method for producing a printed wiring board according to the present invention permits a surface of an inner layer material to be deeply roughened, i.e., to be formed with steep irregularities thereon and thus permits an outer layer material to be firmly joined to the inner layer material. Also, according to the method of the present invention, the defect such as a pink ring can be prevented from being generated.

As described above, in the method for producing a printed wiring board according to the present invention, after the surface of the copper foil of the inner layer material is roughened by the etchant, the copper foil is subjected to the patterning treatment to form the copper conductive pattern layer, followed by the lamination of the outer layer material on the copper conductive pattern layer. Therefore, treatments before patterning such as the rust prevention can be omitted, resulting in the number of manufacturing steps being reduced. When the alkali degreasing and the acid degreasing are carried out prior to the etching, the quality can be improved even if the surface of the copper foil of the inner layer material is dirty.

While the present invention has been described with a certain degree of particularity, obvious modifications and variations are possible in light of the above teachings. It is therefore to be understood that within the scope of the appended claims, the invention may be practiced otherwise than as specifically described.

What is claimed is:

1. A method for roughening a copper surface comprising subjecting the copper surface to etching using an etchant so that the copper surface is provided with acicular protrusions, said etchant including a main component containing at least one first compound selected from the group consisting of oxo acids represented by one of the following formulae:

$XO_m(OH)_n$ and $H_nXO_{m+n}$ wherein X is a central atom, m is an integer of 0 or more and n is an integer of 1 or more and derivatives thereof and at least one second compound selected from the group consisting of peroxides and derivatives thereof; and an auxiliary component containing at least one azole and at least one halide, the at least one azole comprising benzotriazole and the concentration of the benzotriazole in the etchant is 1 to 10 g/l, the at least one halide comprises chloride, the chlorine concentration of the chloride in the etchant is 0.006 to 0.182 g/l, and the chloride is one selected from the group consisting of sodium chloride, potassium chloride and stannous chloride, wherein said acircular protrusions formed from etching said copper surface have a height of about 2 to 5 μm, wherein the roughened copper surface is adapted to be joined to an outer layer material.

2. A method for roughening a copper surface as defined in claim 1, wherein said m in said formulae is 2 or more.

3. A method for roughening a copper surface as defined in claim 1, wherein said m+n in said formulae is 4 or more.

4. A method for roughening a copper surface as defined in claim 1, wherein the first compound comprises an oxo acid or an oxo acid derivative which is selected from the group consisting of sulfuric acid, nitric acid, boric acid, perchloric acid, chloric acid, phosphoric acid, 2-hydroxyethane-1-sulfonic acid, methanesulfonic acid, aminosulfonic acid, hydroxybenzenesulfonic acid, nitrobenzenesulfonic acid and p-aminobenzenesulfonic acid.

5. A method for producing a printed wiring board, using an inner layer material having an insulating layer on which a copper foil layer is laminated, the method comprising
roughening a surface of the copper foil layer of the inner layer material by an etchant to form acicular protrusions thereon;
subjecting the roughened copper foil layer to patterning to form a copper conductive pattern layer; and then laminating an insulating outer layer material on a surface of the copper conductive pattern layer;
said etchant including a main component containing at least one first compound selected from the group consisting of oxo acids represented by one of the following formulae:

$XO_m(OH)_n$ and $H_nXO_{m+n}$ wherein X is a central atom, m is an integer of 0 or more and n is an integer of 1 or more and derivatives thereof and at least one second compound selected from the group consisting of peroxides and derivatives thereof; and an auxiliary component containing at least one azole and at least one halide, the at least one halide comprises chloride, and the chlorine concentration of the chloride in the etchant is 0.006 to 0.182 g/l, wherein said acircular protrusions formed from said roughening of said copper foil have a height of about 2 to 5 μm.

6. A method for producing a printed wiring board as defined in claim 5, wherein a degreasing treatment and a predip treatment are conducted prior to the roughening step using said etchant.

7. A method for producing a printed wiring board as defined in claim 6, wherein said m in said formulae is 2 or more.

8. A method for producing a printed wiring board as defined in claim 6, wherein said m+n in said formulae is 4 or more.

9. A method for producing a printed wiring board as defined in claim 5, wherein said m in said formulae is 2 or more.

10. A method for producing a printed wiring board as defined in claim 9, wherein said m+n in said formulae is 4 or more.

11. A method for producing a printed wiring board as defined in claim 5, wherein the at least one azole comprises benzotriazole, and the concentration of the benozotriazole in the etchant is 1 to 10 g/l.

12. A method for producing a printed wiring board as defined in claim 11, wherein the chloride is one selected from the group consisting of sodium chloride, potassium chloride and stannous chloride.

13. A method for producing a printed wiring board as defined in claim 11, wherein the first compound comprises an oxo acid or an oxo acid derivative which is selected from the group consisting of sulfuric acid, nitric acid, boric acid, perchloric acid, chloric acid, phosphoric acid, 2-hydroxyethane-1-sulfonic acid, methanesulfonic acid, aminosulfonic acid, hydroxybenzenesulfonic acid, nitrobenzenesulfonic acid and p-aminobenzenesulfonic acid.

14. A method for roughening a copper surface of a copper-clad laminate to have acicular protrusions, comprising the steps of:
removing a rust preventive film from a surface of the copper-clad laminate to expose a copper surface; and
dipping the copper surface of the copper-clad laminate in an etchant including a main component containing at least one acid selected from the group consisting of sulfuric acid, nitric acid, boric acid, perchloric acid, chloric acid, phosphoric acid, 2-hydroxyethane-1-sulfonic acid, methanesulfonic acid, aminosulfonic acid, hydroxybenzenesulfonic acid, nitrobenzenesulfonic acid and p-aminobenzenesulfonic acid, and a peroxide selected from the group consisting of peroxo acids and peroxanates, and an auxiliary component containing benzotriazole and a chloride selected from the group consisting of sodium chloride, potassium chloride and stannous chloride, wherein the concentration of the benzotraizole in the etchant is 1 to 10 g/l, and wherein the chlorine concentration of the chloride in the etchant is 0.006 to 0.182 g/l, thereby etching the copper surface of the copper-clad laminate to have acicular protrusions, wherein said acircular protrusions formed from etching said copper surface have a height of about 2 to 5 µm, wherein the roughened copper surface is adapted to be joined to outer layer material.

\* \* \* \* \*